(12) United States Patent
Inoue

(10) Patent No.: US 11,444,431 B2
(45) Date of Patent: Sep. 13, 2022

(54) SURFACE EMITTING LASER

(71) Applicant: SUMITOMO ELECTRIC INDUSTRIES, LTD., Osaka (JP)

(72) Inventor: Daisuke Inoue, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 234 days.

(21) Appl. No.: 16/877,991

(22) Filed: May 19, 2020

(65) Prior Publication Data

US 2020/0412090 A1    Dec. 31, 2020

(30) Foreign Application Priority Data

Jun. 28, 2019    (JP) .............................. JP2019-122049

(51) Int. Cl.
| | |
|---|---|
| *H01S 3/00* | (2006.01) |
| *H01S 5/042* | (2006.01) |
| *H01S 5/343* | (2006.01) |
| *H01S 5/183* | (2006.01) |

(52) U.S. Cl.
CPC ...... *H01S 5/04256* (2019.08); *H01S 5/04254* (2019.08); *H01S 5/18313* (2013.01); *H01S 5/18347* (2013.01); *H01S 5/34313* (2013.01); *H01S 5/18372* (2013.01)

(58) Field of Classification Search
CPC ............. H01S 5/04256; H01S 5/04254; H01S 5/18313; H01S 5/18347; H01S 5/18372; H01S 5/34313
See application file for complete search history.

(56) References Cited

U.S. PATENT DOCUMENTS

| | | | | |
|---|---|---|---|---|
| 5,500,868 A | * | 3/1996 | Kurihara | ............. H01S 5/18305 372/46.015 |
| 10,916,917 B2 | * | 2/2021 | Tsuji | ..................... H01S 5/2063 |

(Continued)

FOREIGN PATENT DOCUMENTS

JP    2019-033210    2/2019

OTHER PUBLICATIONS

Chang, C., et al., "Parasitics and Design Considerations on Oxide Implant VCSELs." article, IEEE Photonics Technology Letters, vol. 13, No. 12, Dec. 2001, pp. 1274-1276, XP-001076755.

*Primary Examiner* — Kinam Park
(74) *Attorney, Agent, or Firm* — IPUSA, PLLC

(57) ABSTRACT

A surface emitting laser includes a substrate, a lower contact layer disposed on the substrate, a semiconductor layer mesa including a lower reflector layer, an active layer, an upper reflector layer, and an upper contact layer which are laminated, in the order named, on the lower contact layer, an annular electrode disposed on the upper contact layer, and a light transmitting window situated inside the annular electrode to transmit laser light, wherein the upper reflector layer includes a first region and a second region, the first region being inclusive of an area situated directly below the electrode and the light transmitting window, the second region being inclusive of an area outside the mesa and inclusive of a surrounding area of the first region within the mesa, and wherein a proton concentration in the first region is lower than a proton concentration in the second region.

4 Claims, 15 Drawing Sheets

(56) References Cited

U.S. PATENT DOCUMENTS

| | | | | |
|---|---|---|---|---|
| 2004/0165636 A1* | 8/2004 | Ezaki | .................. | H01S 5/18313 |
| | | | | 372/96 |
| 2006/0056473 A1* | 3/2006 | Tanigawa | ............ | H01S 5/18347 |
| | | | | 372/43.01 |
| 2015/0043605 A1* | 2/2015 | Koyama | ............. | H01S 5/18313 |
| | | | | 372/50.1 |
| 2018/0048125 A1* | 2/2018 | Hayakawa | ............ | G02B 6/3897 |
| 2018/0278022 A1* | 9/2018 | Li | ........................ | H01S 5/18313 |
| 2020/0136351 A1* | 4/2020 | Tsuji | .................... | H01S 5/18313 |
| 2020/0136352 A1* | 4/2020 | Tsuji | ..................... | H01S 5/2063 |
| 2020/0313391 A1* | 10/2020 | Li | ........................ | H01S 5/18341 |
| 2020/0358251 A1* | 11/2020 | Tsuji | .................... | H01S 5/04256 |

\* cited by examiner

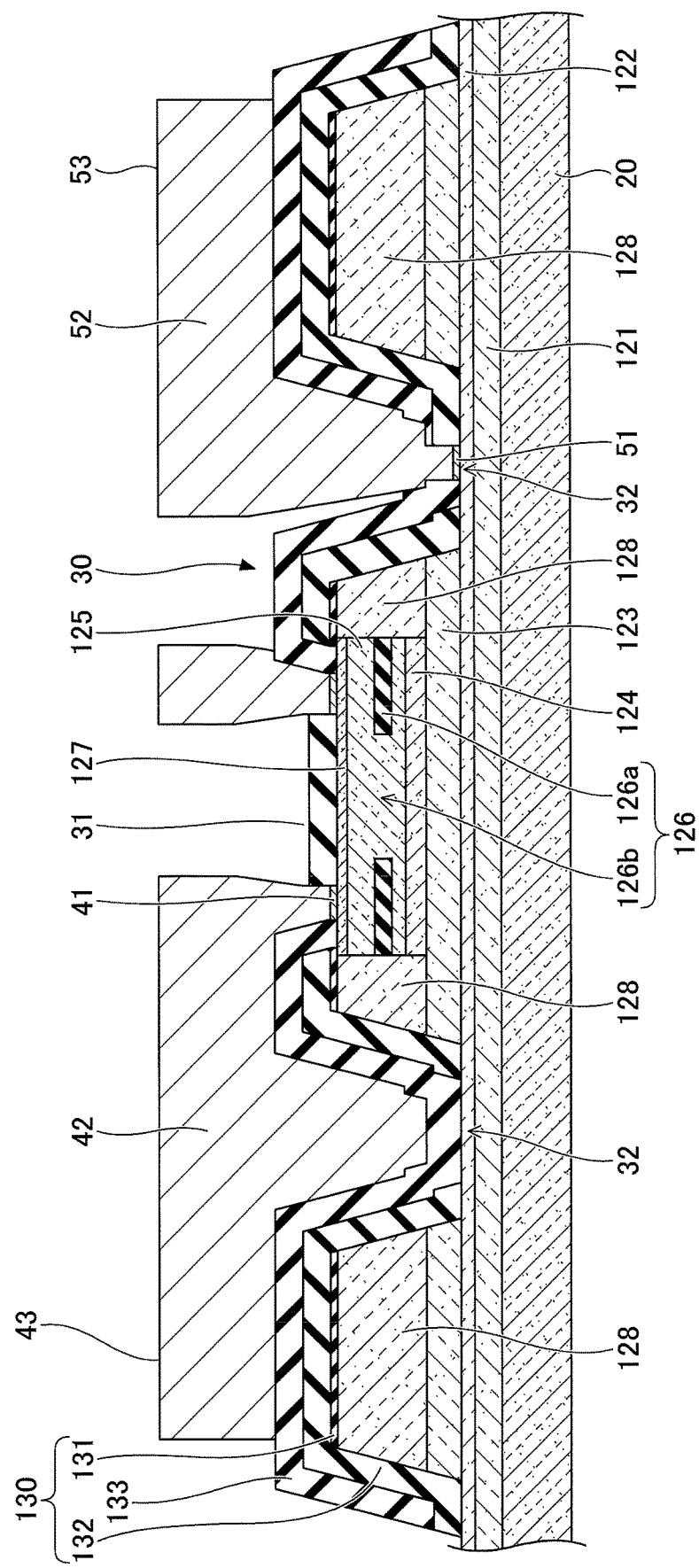

SURFACE EMITTING LASER

BACKGROUND OF THE INVENTION

1. Field of the Invention

The disclosures herein relate to a surface emitting laser.

2. Description of the Related Art

A vertical cavity surface emitting laser (VCSEL), which is also referred to as a surface emitting laser, has two reflector layers and an active layer interposed between the reflector layers disposed over a semiconductor substrate, and emits light in the direction perpendicular to the surface of the semiconductor substrate. A surface emitting laser has a current confinement structure that is made by forming a mesa with the active layer and the reflector layers and by selectively oxidizing a portion of the reflector layers of the mesa to form an oxide layer. Literature with respect to such a surface emitting laser describes that protons are injected into a mesa area to reduce parasitic capacitance, thereby enabling high-speed operations (Non-Patent Document 1).

A surface emitting layer is required of even higher speed operation.

[Related-Art Documents]
[Patent Document 1] Japanese Laid-open Patent Publication No. 2019-33210
[Non-Patent Document 1] Chang, C., et al., "Parasitics and Design Consideration on Oxide Implant VCSELs." article, IEEE Photonics Technology Letters, vol. 13, No. 12, December 2001, pp. 1274-1276, XP-001076755

SUMMARY OF THE INVENTION

According to one aspect of a present embodiment, a surface emitting laser includes a substrate, a lower contact layer disposed on the substrate, a semiconductor layer mesa including a lower reflector layer, an active layer, an upper reflector layer, and an upper contact layer which are laminated, in the order named, on the lower contact layer, an annular electrode disposed on the upper contact layer, and a light transmitting window situated inside the annular electrode to transmit laser light, wherein the upper reflector layer includes a first region and a second region, the first region being inclusive of an area situated directly below the electrode and the light transmitting window, the second region being inclusive of an area outside the mesa and inclusive of a surrounding area of the first region within the mesa having the first region situated therein, and wherein a proton concentration in the first region is lower than a proton concentration in the second region.

According to at least one embodiment, the surface emitting laser of the present disclosures enables high speed operation.

BRIEF DESCRIPTION OF THE DRAWINGS

FIG. 15 is a drawing illustrating the manufacturing steps of making the surface emitting laser according to the embodiment of the present disclosures.

DESCRIPTION OF THE PREFERRED EMBODIMENTS

Figure 1:
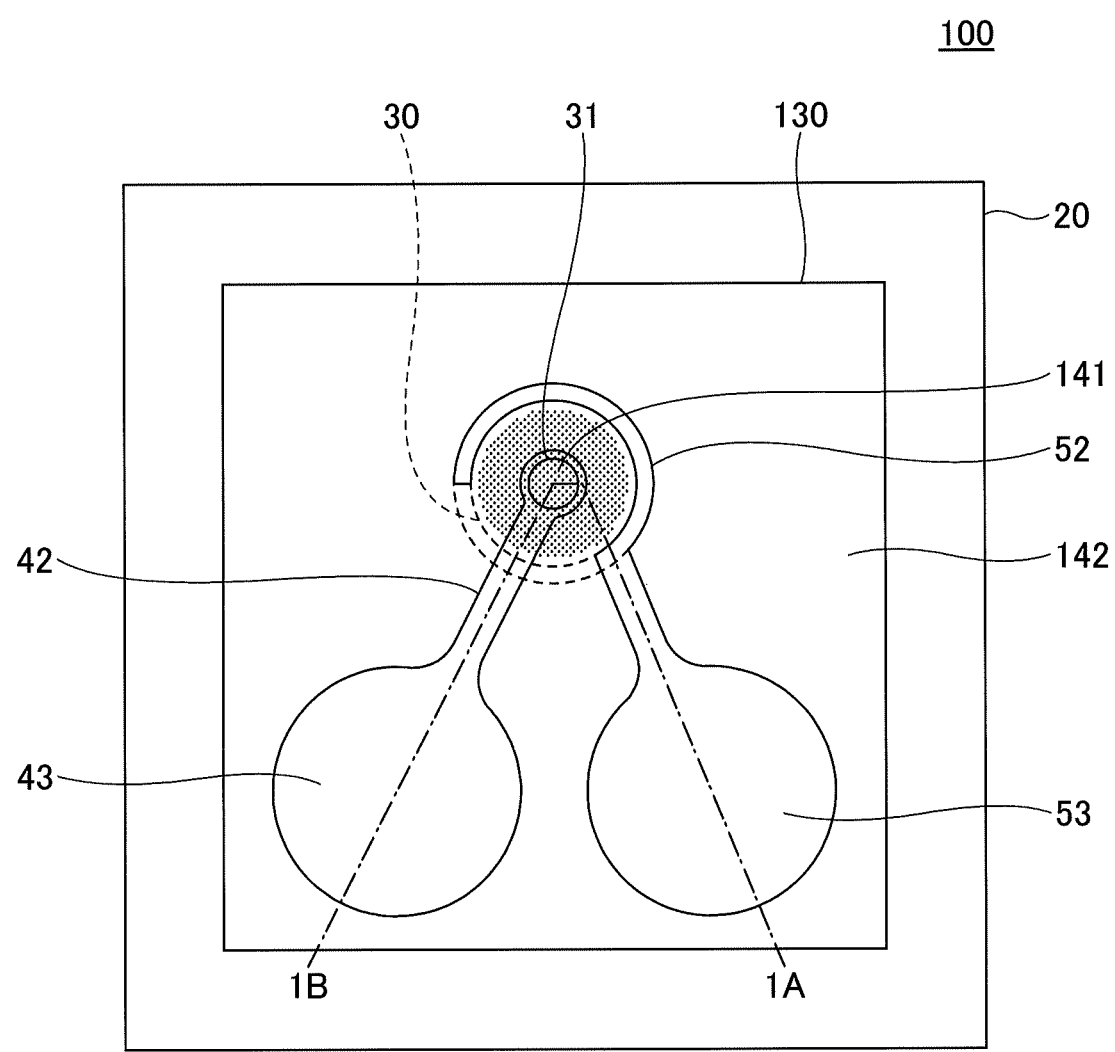
FIG. 1 is a top view of a surface emitting laser according to an embodiment of the present disclosures.

Embodiments will be described in the following.
[Description of Embodiments of the Present Disclosures]
Embodiments of the present disclosures will be listed and described first. In the following description, the same or corresponding elements are referred to by the same reference numerals, and a duplicate description thereof will be omitted.

[1] According to an embodiment of the present disclosures, a surface emitting laser includes a substrate, a lower contact layer disposed on the substrate, a semiconductor layer mesa including a lower reflector layer, an active layer, an upper reflector layer, and an upper contact layer which are laminated, in the order named, on the lower contact layer, an annular electrode disposed on the upper contact layer, and a light transmitting window situated inside the annular electrode to transmit laser light, wherein the upper reflector layer includes a first region and a second region, the first region being inclusive of an area situated directly below the electrode and the light transmitting window, the second region being inclusive of an area outside the mesa and inclusive of a surrounding area of the first region within the mesa having the first region situated therein, and wherein a proton concentration in the first region is lower than a proton concentration in the second region.

With this arrangement, the surface emitting laser enables high speed operation.

[2] The upper reflector layer has carbon doped therein as an impurity element, and the second region has the proton concentration therein higher than a carbon concentration therein.

This causes the second region to have a high resistance, thereby enabling the surface emitting laser to operate at high speed.

[3] The first region has the proton concentration therein lower than a carbon concentration therein.

The first region needs to conduct current, and, thus, an increase in the resistance thereof should be avoided.

[4] The proton concentration in the second region is greater than or equal to $1\times10^{18}$ cm$^{-3}$ and less than or equal to $1\times10^{20}$ cm$^{-3}$.

This causes the second region to have a high resistance, thereby enabling the surface emitting laser to operate at high speed.

[5] A first electrode pad connected to the upper contact layer and a second electrode pad connected to the lower contact layer are provided, and the first electrode pad and the second electrode pad are disposed on the second region.

An increase in the resistance of the portion situated under the first electrode pad and the second electrode pad enables the surface emitting laser to operate at high speed.

[Details of Embodiments of the Present Disclosures]

In the following, an embodiment of the present disclosures will be described in detail, but the present embodiments are not limited to those disclosed herein.

<Surface Emitting Laser>

Figure 2:
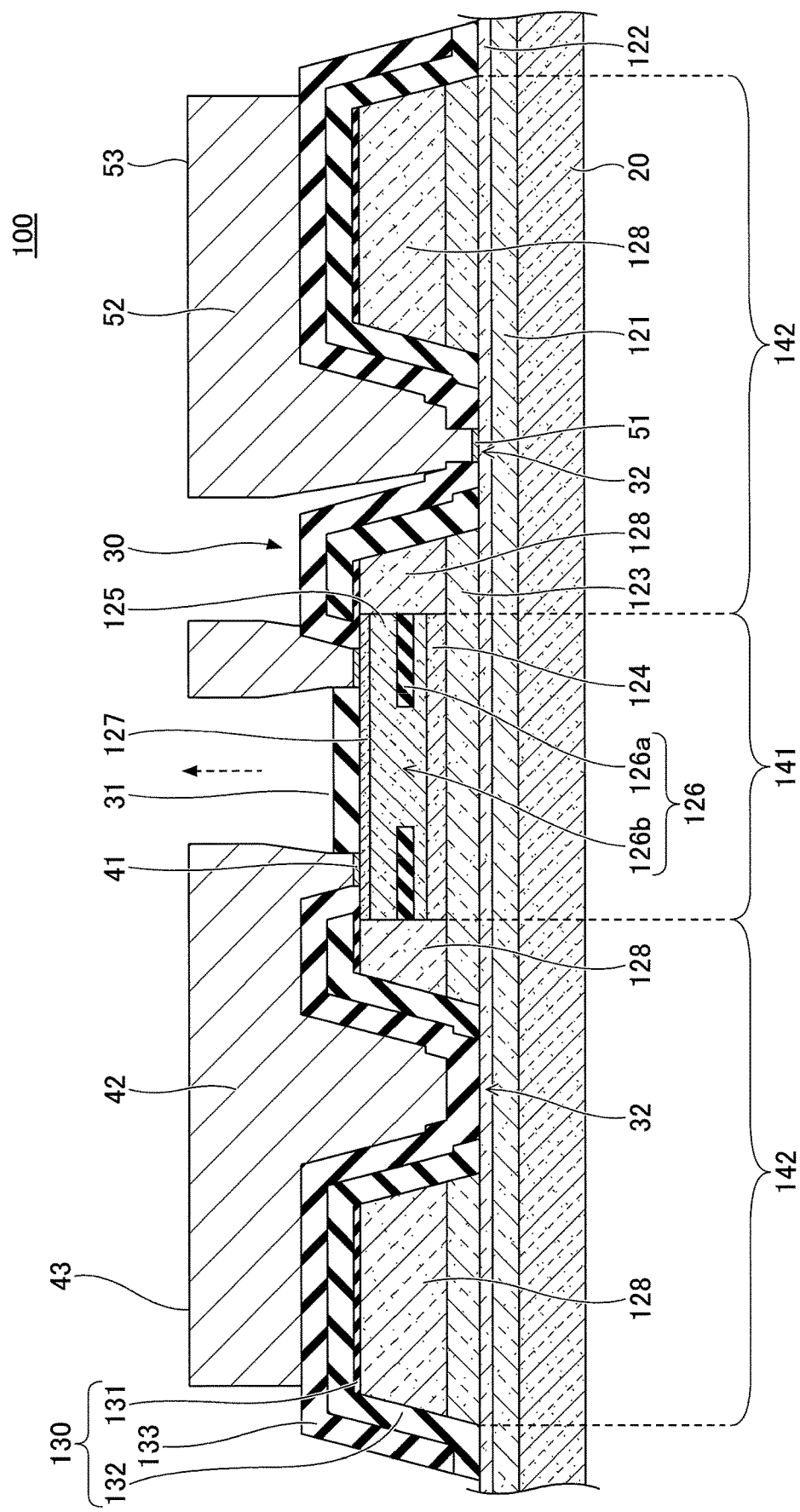
FIG. 2 is a cross-sectional view of a surface emitting laser according to the embodiment of the present disclosures.

A surface emitting laser 100 according to the present embodiment will be described with reference to FIG. 1 and FIG. 2. FIG. 1 is a top view of the surface emitting laser 100 according to the present embodiment. FIG. 2 is a cross-sectional view taken along the dash-and-dot lines 1A-1B in FIG. 1. The surface emitting laser 100 is such that a first lower DBR (distributed Bragg reflector) layer 121, a lower contact layer 122, a second lower DBR layer 123, an active layer 124, an upper DBR layer 125, and an upper contact layer 127 are formed in the order named on a substrate 20. In the present application, the second lower DBR layer 123 or a set of the first lower DBR layer 121 and the second lower DBR layer 123 is referred to as a lower reflector layer, and the upper DBR layer 125 is referred to as an upper reflector layer.

The upper DBR layer 125 has an oxidized region 126a that is made by oxidizing part of the layers constituting the upper DBR layer 125. Upon the formation of the oxidized region 126a, the unoxidized region serves as an aperture region 126b.

Accordingly, the surface emitting laser has a current confinement structure 126 comprised of the oxidized region 126a and the aperture region 126b. The oxidized region 126a is made by oxidizing a mesa 30 from the perimeter thereof. The oxidized region 126a contains aluminum oxide (Al$_2$O$_3$), for example, and has an insulating property, thereby conducting less current than the aperture region 126b. The aperture region 126b, which more readily conducts current than the oxidized region 126a, thus serves as a current path. Use of the current confinement structure 126 as described above allows current to be efficiently injected. In the present embodiment, the diameter of the aperture region 126b is 7.5 µm, for example.

The substrate 20 may be a semiconductor substrate made of gallium arsenide (GaAs) having a semi-insulating property, for example. A buffer layer made of GaAs and AlGaAs may be disposed between the substrate 20 and the first lower DBR layer 121.

The first lower DBR layer 121, the second lower DBR layer 123, and the upper DBR layer 125 are a multilayer semiconductor film in which Al$_x$Ga$_{1-x}$As (x=0.16) and Al$_y$Ga$_{1-y}$As (y=0.9) with an optical film thickness of λ/4 are alternately laminated. The first lower DBR layer 121 is an i-type semiconductor layer with no dopant impurities. The second lower DBR layer 123 is an n-type semiconductor layer, which is doped with silicon (Si) serving as an impurity at a concentration of $7\times10^{17}$ cm$^{-3}$ or more and $2\times10^{18}$ cm$^{-3}$ or less, for example. The upper DBR layer 125 is a p-type semiconductor layer, which is doped with zinc (Zn) serving as an impurity at a concentration of $1\times10^{18}$ cm$^{-3}$ or more and $1\times10^{19}$ cm$^{-3}$ or less, for example.

The lower contact layer 122 is approximately 400 nm in thickness and made of n-type Al$_x$Ga$_{1-x}$As (x=0.1) that is doped with Si serving as an impurity at a concentration of $3\times10^{18}$ cm$^{-3}$, for example. The upper contact layer 127 is approximately 100 nm in thickness and made of p-type Al$_x$Ga$_{1-x}$As (x=0.16) that is doped with Zn serving as an impurity at a concentration of $1\times10^{19}$ cm$^{-3}$, for example.

The active layer 124 has a multiple quantum well (MQW) structure in which In$_y$Ga$_{1-y}$As (y=0.107) layers and Al$_x$Ga$_{1-x}$As (x=0.3) layers are alternately laminated, for example, providing an optical gain. It may be noted that the substrate 20, the first lower DBR layer 121, the lower contact layer 122, the second lower DBR layer 123, the active layer 124, the upper DBR layer 125, and the upper contact layer 127 may be made of different compound semiconductors from those noted above.

The mesa 30 is constituted by the second lower DBR layer 123, the active layer 124, the upper DBR layer 125, and the upper contact layer 127. Specifically, the second lower DBR layer 123, the active layer 124, the upper DBR layer 125, and the upper contact layer 127 are removed around the area for erecting the mesa 30 to form a groove 32, thereby forming the mesa 30 constituted by the semiconductor layers. The height of the mesa 30 is greater than or equal to 4.5 µm and less than or equal to 5.0 µm, for example. The width of the top face is 30 µm, for example. The mesa 30 has the active layer 124, the upper DBR layer 125, and the upper contact layer 127 at the center thereof, and has a high-resistance region 128 formed in the peripheral area thereof.

An insulating film 130 is formed on the semiconductor layers at the places including the upper surface and lateral surface of the mesa 30. The insulating film 130 is made of silicon nitride (SiN), silicon oxynitride (SiON), or the like. In the present embodiment, the insulating film 130 includes a first insulating film 131, a second insulating film 132, and a third insulating film 133.

A p electrode 41 is formed on the upper contact layer 127 at the top of the mesa 30. An n electrode 51 is formed on the lower contact layer 122 constituting the bottom face of the groove 32. An interconnect 42 connected to a p electrode pad 43 is disposed on the p electrode 41 at the top of the mesa 30. An interconnect 52 connected to an n electrode pad 53 is disposed on the n electrode 51 situated on the bottom face of the groove 32.

In the present embodiment, the p electrode 41 is made of a film having Ti/Pt/Au laminated in the order named. The n electrode 51 is made of a film in which gold (Au), germanium (Ge), and nickel (Ni) are laminated, for example. The interconnect 42, the interconnect 52, the p electrode pad 43, and the n electrode pad 53 are made of a metal such as Au, for example.

In the surface emitting laser of the present embodiment, bonding wires (not shown) or the like are connected to the p electrode pad 43 and the n electrode pad 53 to inject current into the surface emitting laser. Light emitted by the active layer 124 upon the injection of current oscillates in the resonator constituted by the first lower DBR layer 121, the second lower DBR layer 123, and the upper DBR layer 125, and then comes out of a light transmitting window 31 as a laser beam in the direction indicated by a dashed-line arrow. The light transmitting window 31 is formed inside the p electrode 41 having an annular shape on the top face of the mesa 30. In the present embodiment, the diameter of the p electrode 41 is greater than the diameter of the aperture region 126b.

In the present embodiment, the high-resistance region 128 is not formed in the region inclusive of an area directly below the p electrode 41 and the light transmitting window 31, and is formed in the regions other than the region inclusive of the area directly below the p electrode 41 and the light transmitting window 31. In the present application, the region, in the upper DBR layer 125, inclusive of an area directly below the p electrode 41 and the light transmitting window 31 is denoted as a first region 141. Further, a region comprised of the peripheral portion of the mesa 30 outside the first region 141 and the areas directly below the p electrode pad 43 and the n electrode pad 53 is denoted as a second region 142. Accordingly, the second region 142 has the high-resistance region 128 formed therein, and the first region 141 has the active layer 124, the upper DBR layer 125, and the upper contact layer 127 formed therein.

The high-resistance region 128 is formed by injecting protons ($H^{30}$) into the upper DBR layer 125. As a result, a proton concentration is higher in the second region 142 than in the first region 141. The proton concentration in the second region 142 is greater than or equal to $1 \times 10^{18}$ cm$^{-3}$ and less than or equal to $1 \times 10^{20}$ cm$^{-3}$. Further, the upper DBR layer 125 is doped with C (carbon) serving as an impurity at a concentration of $6 \times 10^{17}$ cm$^{-3}$ to $4 \times 10^{18}$ cm$^{-3}$. Accordingly, the proton concentration is higher than the C concentration in the second region 142, and the proton concentration is lower than the concentration in the first region 141.

<Range and Characteristics of High-Resistance Region>

Surface emitting lasers 201 through 203 having different high-resistance regions 128 were evaluated.

Figure 3:
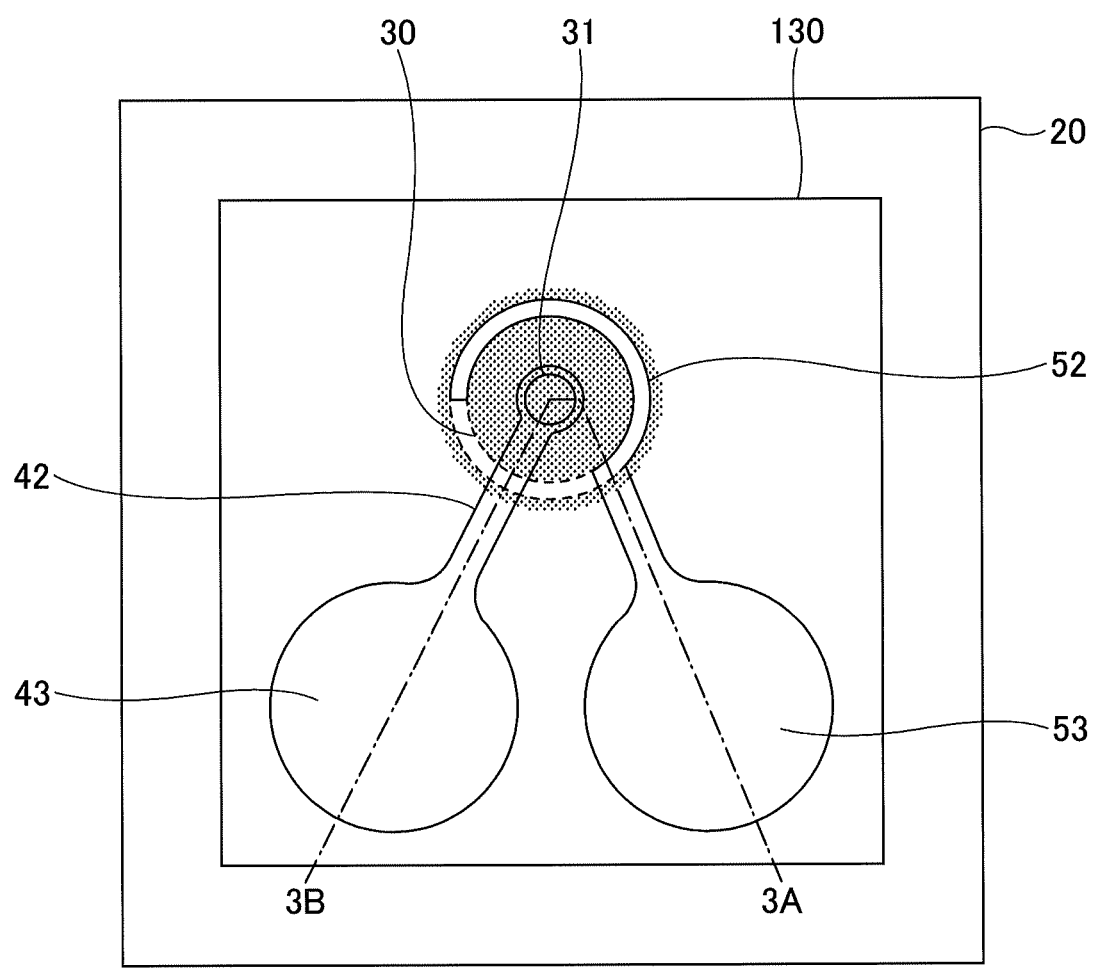
FIG. 3 is a top view of a surface emitting laser for use in comparison.
Figure 4:
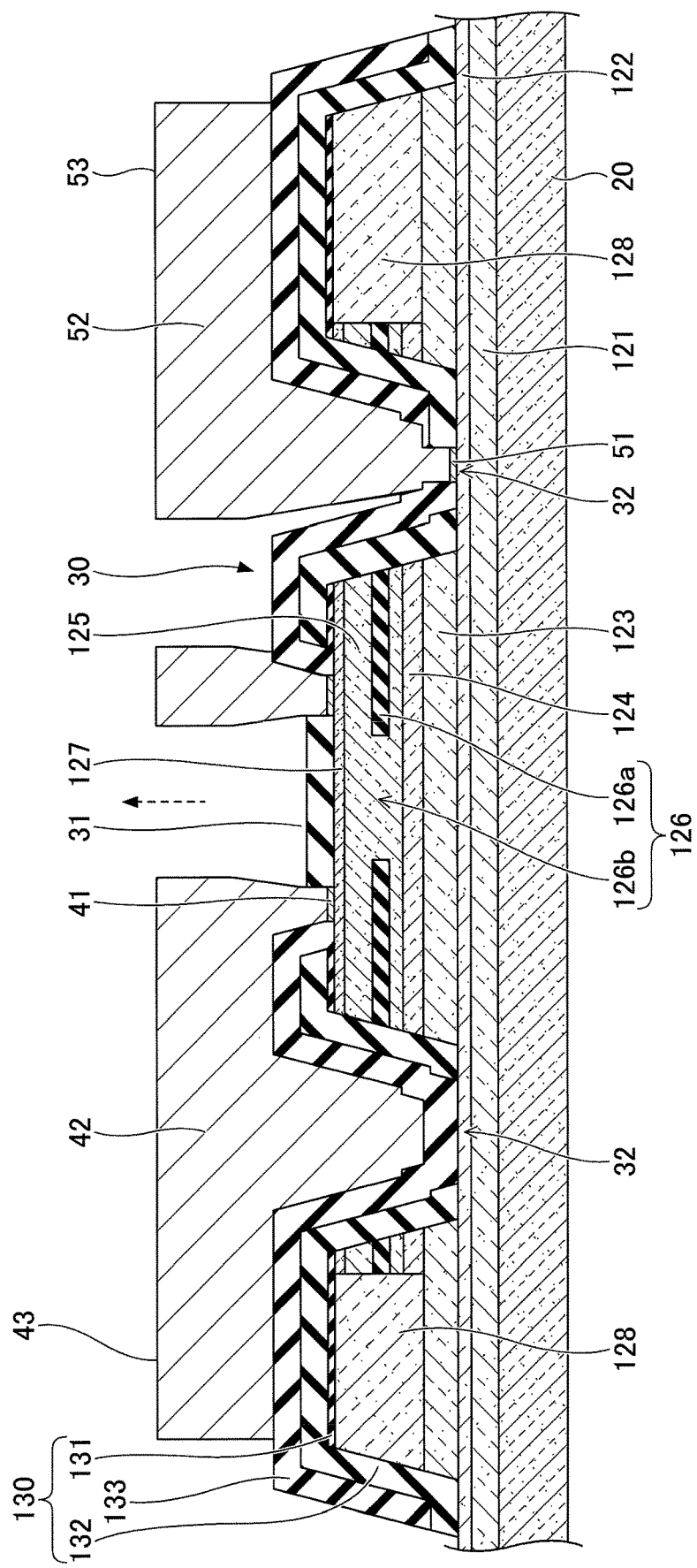
FIG. 4 is a cross-sectional view of the surface emitting laser for use in comparison.

As illustrated in FIG. 3 and FIG. 4, the surface emitting laser 201 has the high-resistance region 128 formed in the regions excluding both the entirety of the mesa 30 and the neighboring areas outside the groove 32 around the mesa 30. FIG. 3 is a top view of the surface emitting laser 201. FIG. 4 is a cross-sectional view taken along the dash-and-dot lines 3A-3B in FIG. 3.

Figure 5:
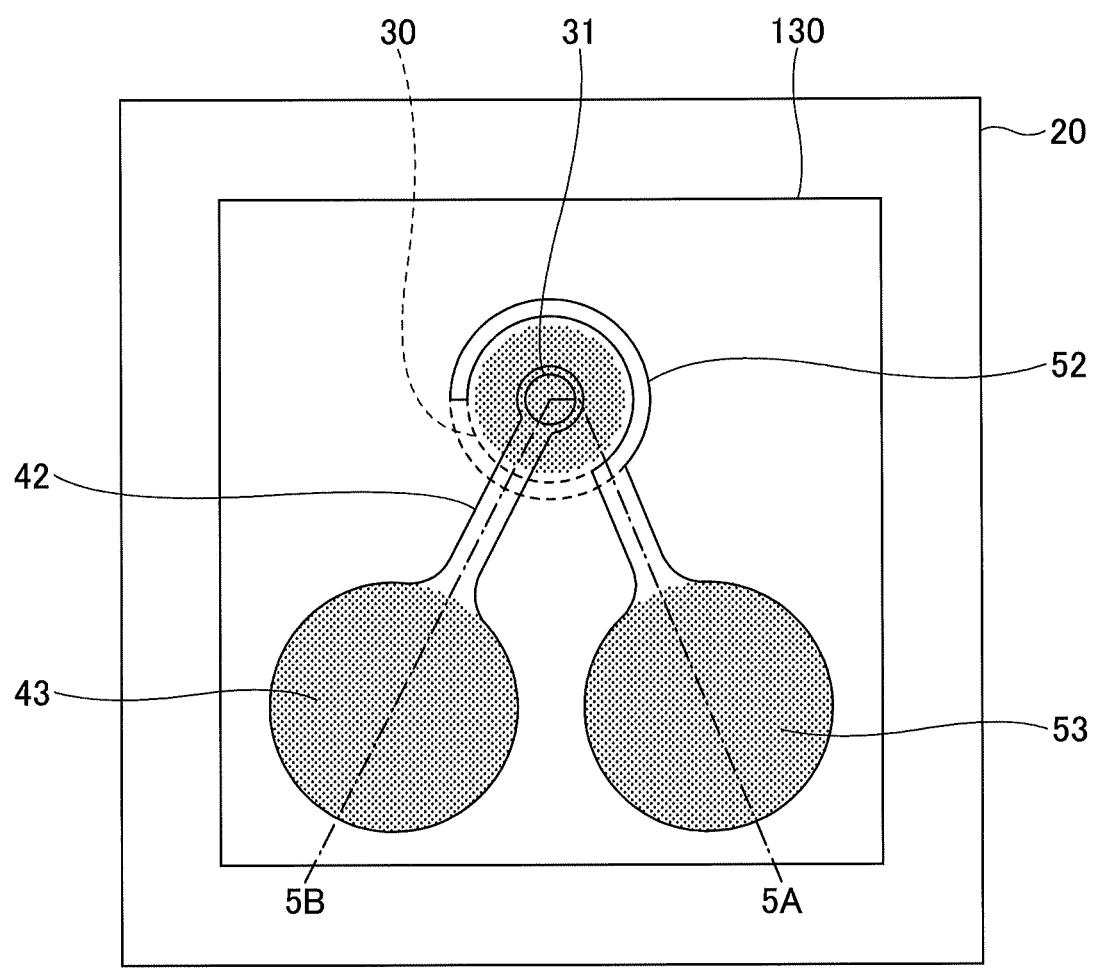
FIG. 5 is a top view of a surface emitting laser for use in comparison.
Figure 6:
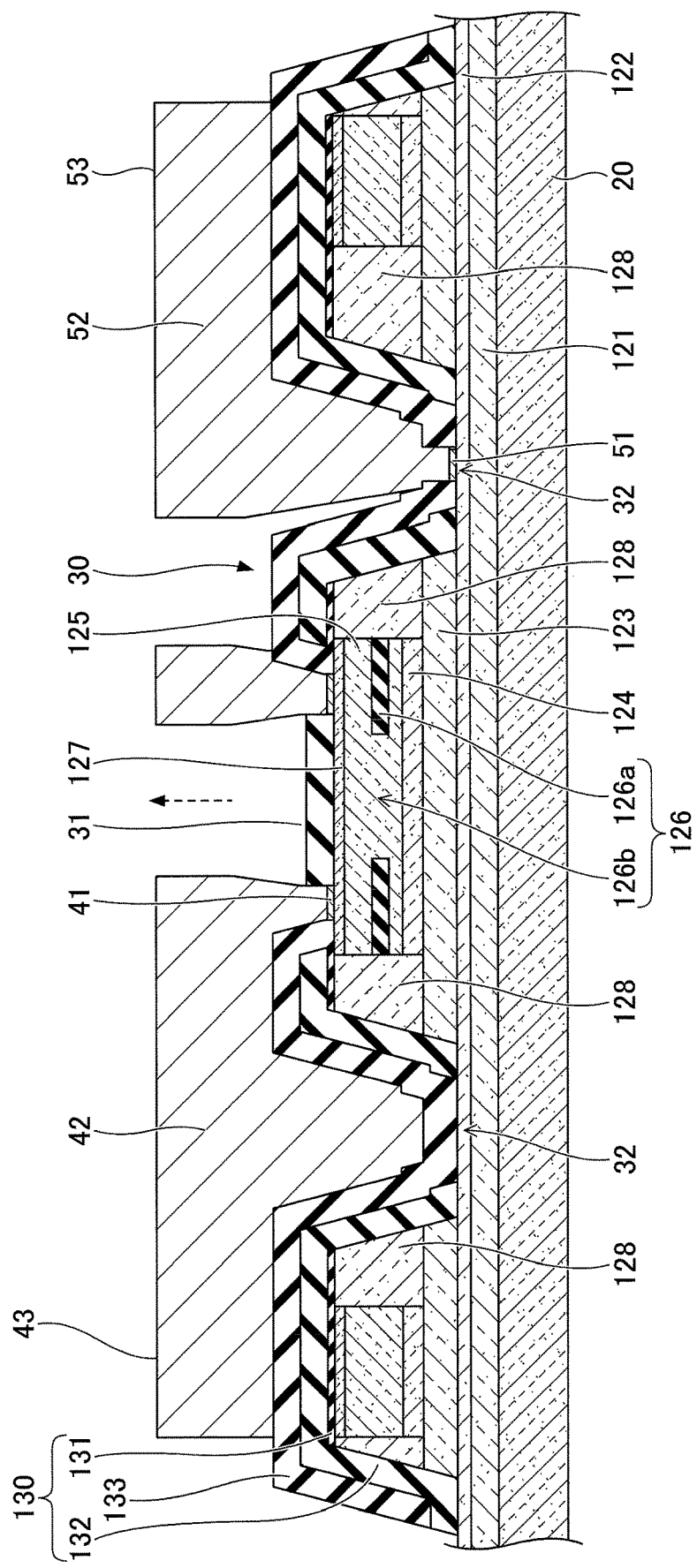
FIG. 6 is a cross-sectional view of the surface emitting laser for use in comparison.

As illustrated in FIG. 5 and FIG. 6, the surface emitting laser 202 has the high-resistance region 128 formed in the regions excluding both the region inclusive of an area directly below either the p electrode 41 or the light transmitting window 31 and the regions inclusive of areas directly blow the p electrode pad 43 and the n electrode pad 53. FIG. 5 is a top view of the surface emitting laser 202. FIG. 6 is a cross-sectional view taken along the dash-and-dot lines 5A-5B in FIG. 5.

Figure 7:
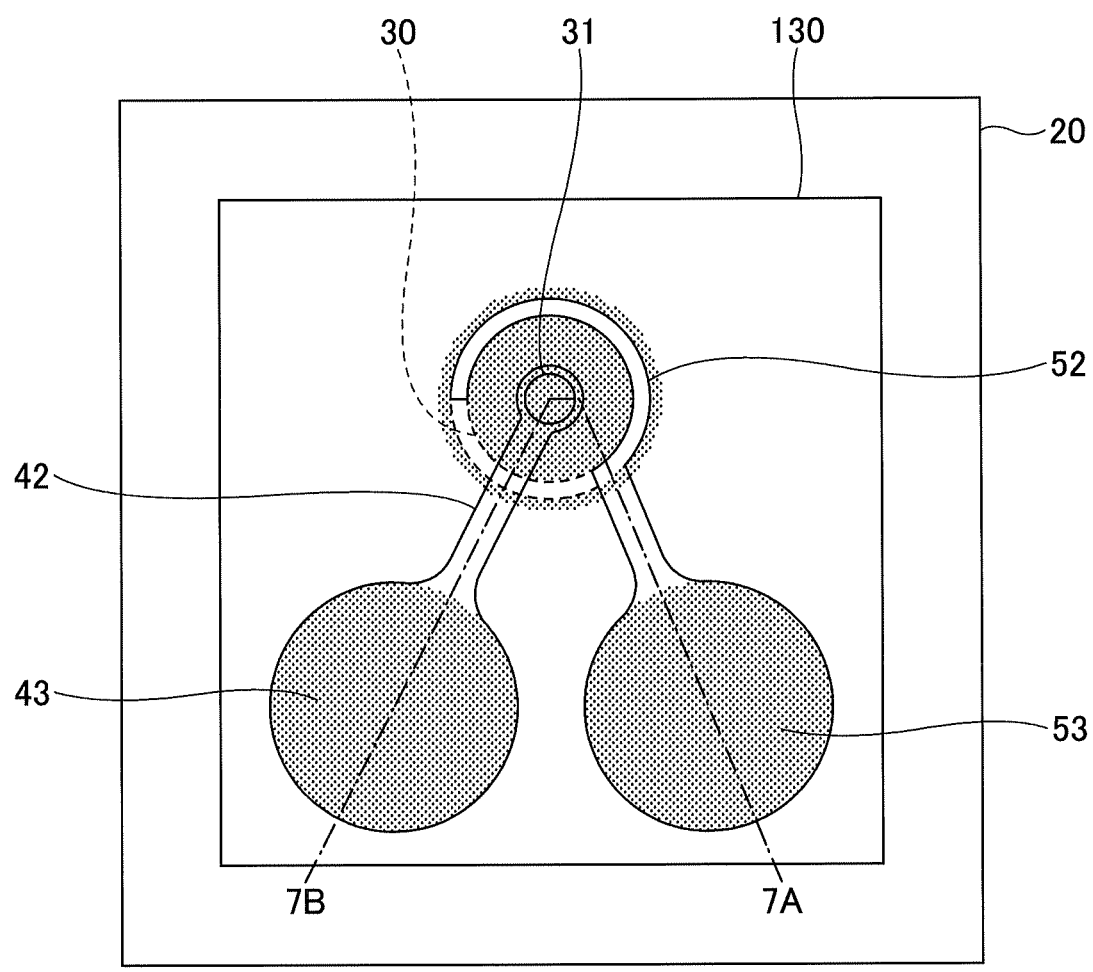
FIG. 7 is a top view of a surface emitting laser for use in comparison.
Figure 8:
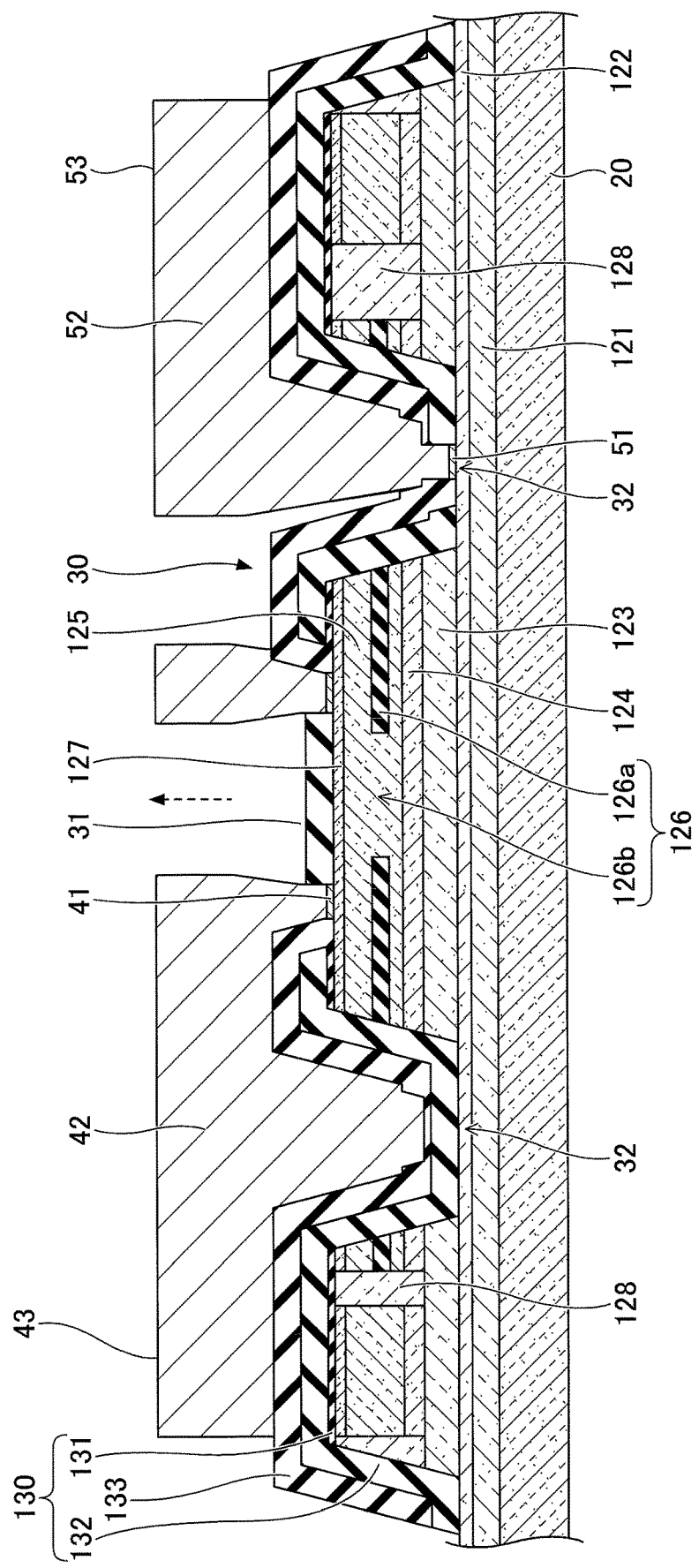
FIG. 8 is a cross-sectional view of the surface emitting laser for use in comparison.

As illustrated in FIG. 7 and FIG. 8, the surface emitting laser 203 has the high-resistance region 128 formed in the regions excluding the entirety of the mesa 30, the neighboring areas outside the groove 32 around the mesa 30, and the regions inclusive of areas directly below the p electrode pad 43 and the n electrode pad 53. FIG. 7 is a top view of the surface emitting laser 203. FIG. 8 is a cross-sectional view taken along the dash-and-dot lines 7A-7B in FIG. 7.

Figure 9:
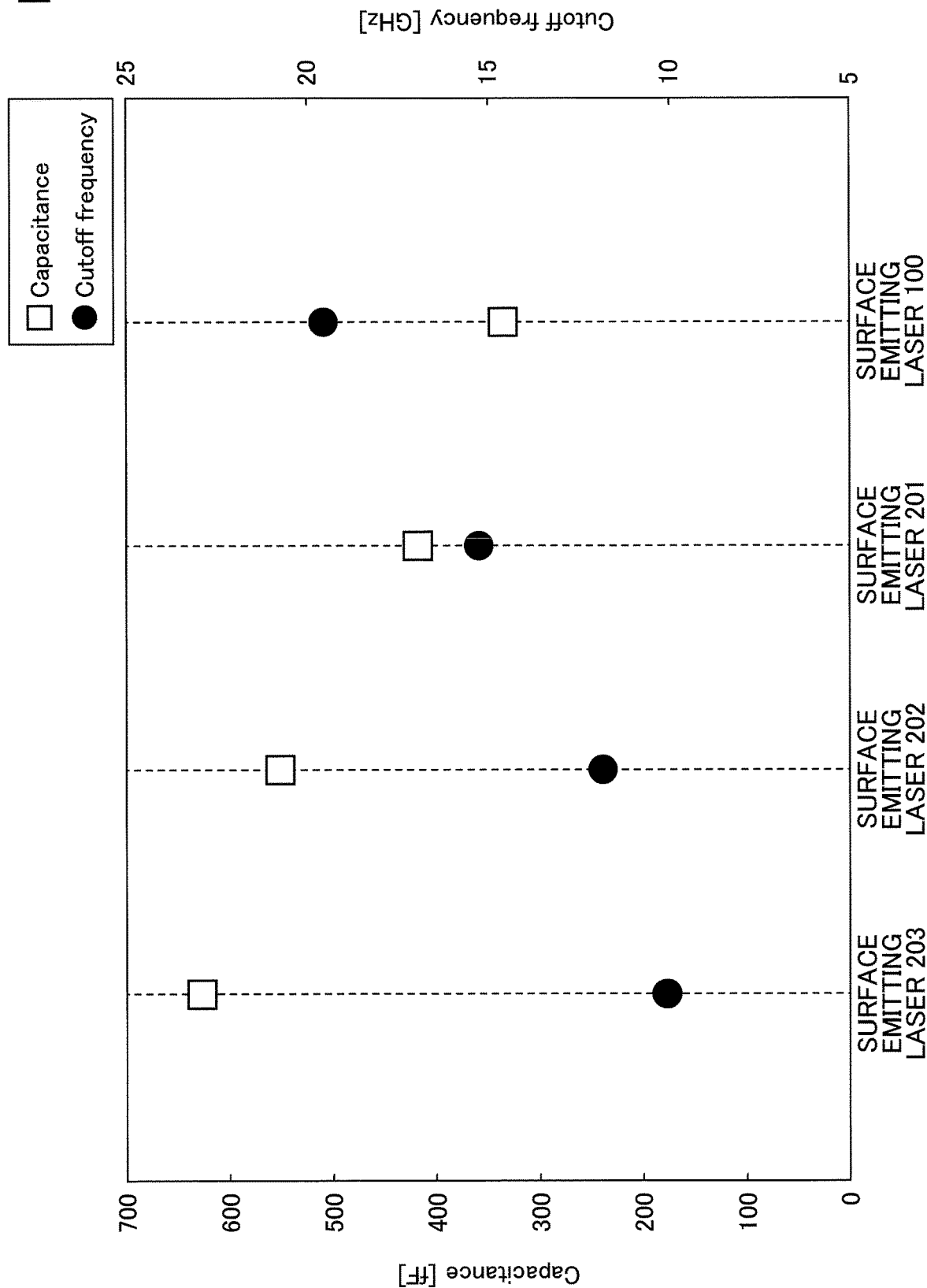
FIG. 9 is a drawing illustrating the parasitic capacitance and cutoff frequency of surface emitting lasers.

FIG. 9 is a drawing illustrating the parasitic capacitance and cutoff frequency of the surface emitting lasers 100, 201, 202, and 203. The surface emitting laser 100 of the present embodiment has a parasitic capacitance of approximately 340 fF and a cutoff frequency of approximately 19.6 GHz. The surface emitting laser 201 has a parasitic capacitance of approximately 420 fF and a cutoff frequency of approximately 15.2 GHz. The surface emitting laser 202 has a parasitic capacitance of approximately 550 fF and a cutoff frequency of approximately 11.8 GHz. The surface emitting laser 203 has a parasitic capacitance of approximately 630 fF and a cutoff frequency of approximately 10.1 GHz.

As shown above, the surface emitting laser 100 of the present embodiment has a higher cutoff frequency than the surface emitting lasers 201, 202, and 203, and thus enables high-speed operation.

<Method of Making Surface Emitting Laser>

In the following, a method of making a surface emitting laser according to the present embodiment will be described with reference to FIG. 10 through FIG. 15.

Figure 10:
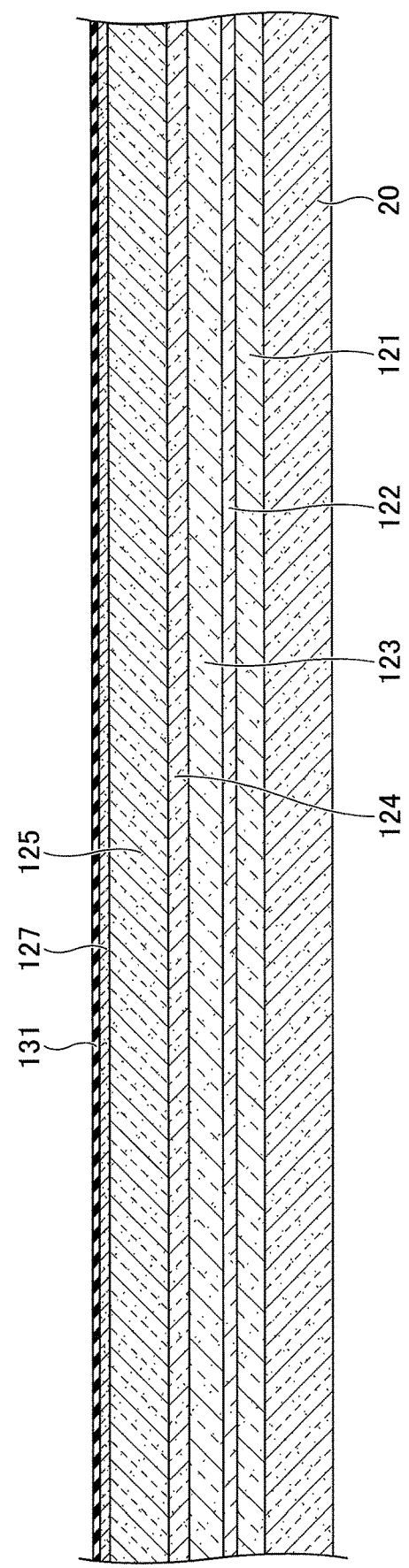
FIG. 10 is a drawing illustrating the manufacturing steps of making the surface emitting laser according to the embodiment of the present disclosures.

At the beginning, a first lower DBR layer 121, a lower contact layer 122, a second lower DBR layer 123, an active layer 124, an upper DBR layer 125, and an upper contact layer 127 are epitaxially deposited one after another on a substrate 20 serving as a wafer, as illustrated in FIG. 10. Specifically, the semiconductor layers, which are the first lower DBR layer 121, the lower contact layer 122, the second lower DBR layer 123, the active layer 124, the upper DBR layer 125, and the upper contact layer 127, are formed by metal organic chemical vapor deposition (MOCVD), molecular beam epitaxy (MBE), or the like.

It may be noted that the upper DBR layer 125 includes an $Al_xGa_{1-x}As$ (0.95≤x≤1.0) layer for forming the oxidized region 126a of the current confinement structure 126. Subsequently, a first insulating film 131 is formed on the upper contact layer 127 by plasma CVD (chemical vapor deposition) or the like, for example.

Figure 11:
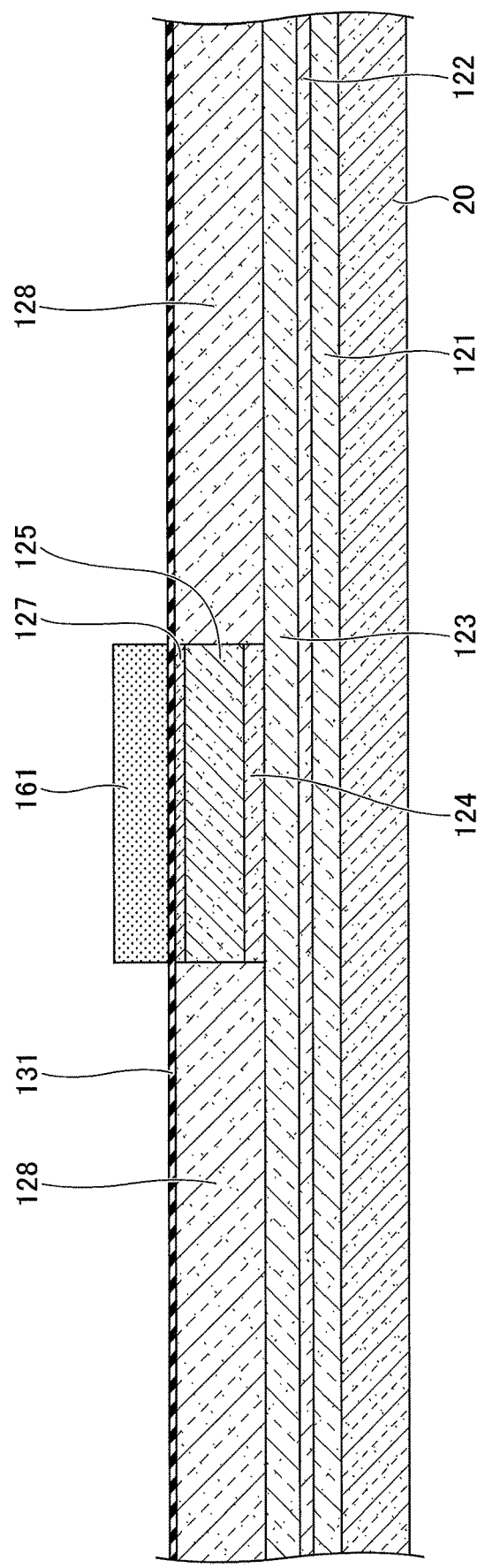
FIG. 11 is a drawing illustrating the manufacturing steps of making the surface emitting laser according to the embodiment of the present disclosures.

As illustrated in FIG. 11, a mask 161 is then formed on the first insulating film 131, followed by injecting protons to form a high-resistance region 128. The depth of ion injection is less than or equal to 3.5 µm, for example. Protons are injected into the upper contact layer 127, the upper DBR layer 125, and the active layer 124 at the place where the mask 161 is not provided, thereby forming the high-resistance region 128. It may be noted that protons are not injected into the portion that is covered with the mask 161.

Figure 12:
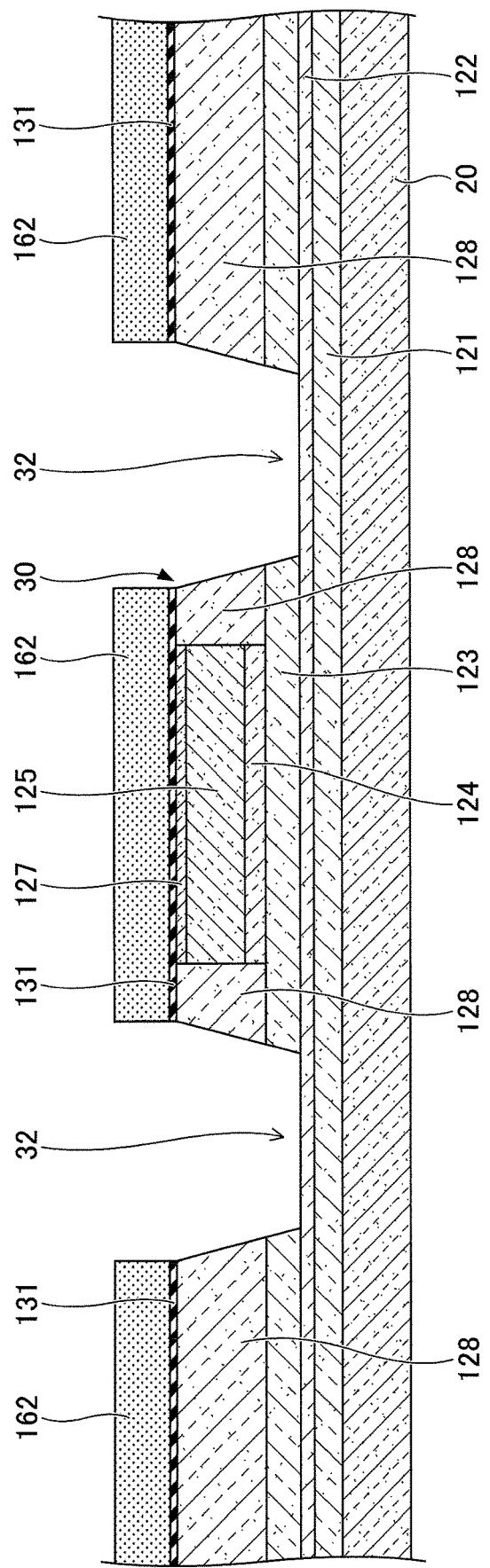
FIG. 12 is a drawing illustrating the manufacturing steps of making the surface emitting laser according to the embodiment of the present disclosures.

Subsequently, as illustrated in FIG. 12, the mask 161 is removed by use of an organic solvent or the like, followed by forming another mask 162. The mask 162 is larger than the mask 161, and covers part of the high-resistance region 128 and the portion that was not subjected to proton injection.

Thereafter, the high-resistance region 128 and the second lower DBR layer 123 are removed by dry etching at the places where the mask 162 is not provided, until the lower contact layer 122 is exposed, thereby forming the groove 32. This results in the formation of the mesa 30. For this dry etching, an apparatus for inductively coupled plasma reactive ion etching (ICP-RIE) may be used, for example. The mask 162 is subsequently removed by an organic solvent or the like.

Figure 13:
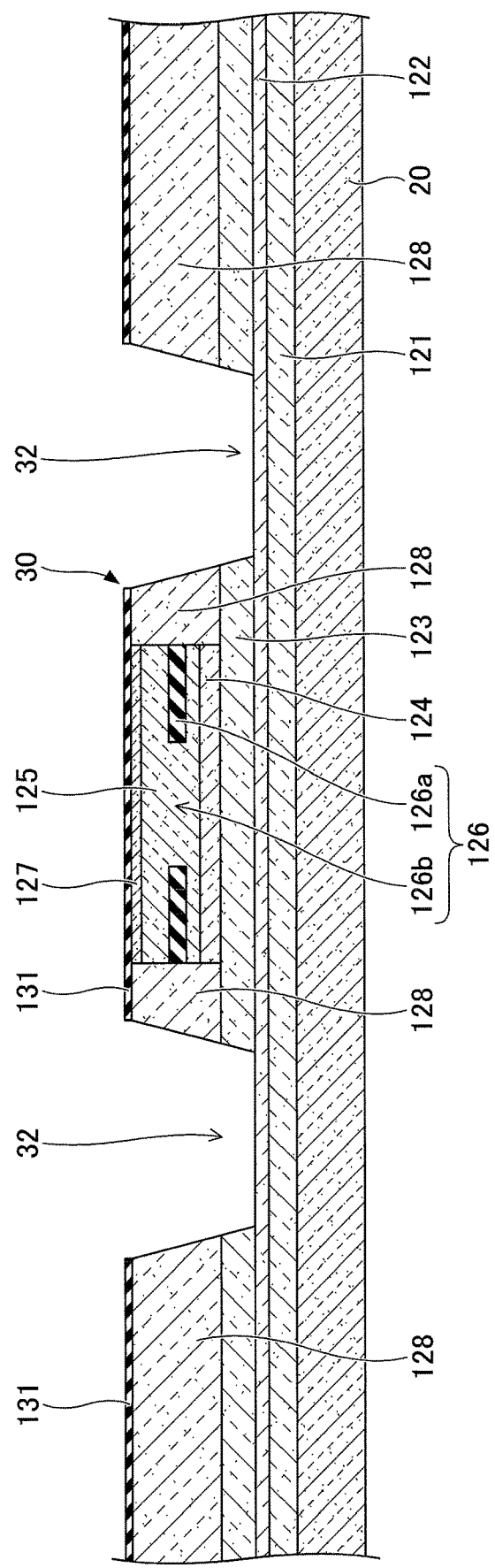
FIG. 13 is a drawing illustrating the manufacturing steps of making the surface emitting laser according to the embodiment of the present disclosures.

As illustrated in FIG. 13, the $Al_xGa_{1-x}As$ (0.9≤x≤1.0) layer of the upper DBR layer 125 is heated to approximately 400° C. in a steam atmosphere, for example, to be oxidized from the lateral surface of the mesa 30, which results in the formation of the oxidized region 126a. The time length for heating is adjusted in the formation of the oxidized region 126a such that the aperture region 126b, which is an unoxidized portion surrounded by the oxidized region 126a, becomes a predetermined size. Thereafter, dry etching is performed to remove the upper contact layer 127 and the first lower DBR layer 121 to form a groove having an 8.0-µm depth (not shown) for device isolation purposes, for example.

Figure 14:
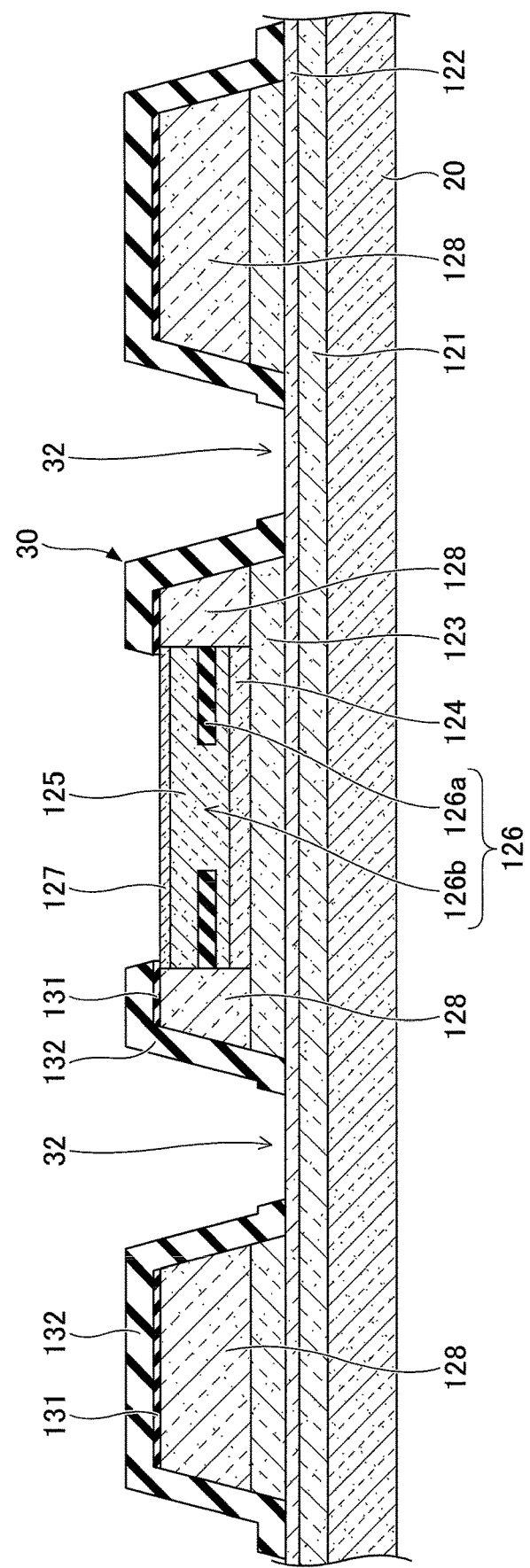
FIG. 14 is a drawing illustrating the manufacturing steps of making the surface emitting laser according to the embodiment of the present disclosures.

As illustrated in FIG. 14, plasma CVD or the like is performed to form a second insulating film 132, followed by forming openings through the second insulating film 132 at the top face of the mesa 30 and at the bottom face of the groove 32, for example.

As illustrated in FIG. 15, a third insulating film 133 is then formed, followed by forming openings through the third insulating film 133 at part of the top face of the mesa 30 and at the bottom of the groove 32. Subsequently, resist patterns are formed and vacuum vapor deposition is performed to form the p electrode 41 on the upper contact layer 127 and the n electrode 51 on the lower contact layer 122. Ohmic contact is then established through heat treatment.

Plating or the like is thereafter performed to form an interconnect 42 on the p electrode 41 and on the third insulating film 133 and to form an interconnect 52 on the n electrode 51 and on the third insulating film 133. This results in the formation of a p electrode pad 43 electrically connected to the p electrode 41 through the interconnect 42 and an n electrode pad 53 electrically connected to the n electrode 51 through the interconnect 52. The substrate 20 provided as a wafer is then divided to produce surface emitting laser chips.

The manufacturing steps described above serves to produce the surface emitting laser of the present embodiment.

Although one or more embodiments have heretofore been described, any particular embodiments are non-limiting, and various variations and modifications may be made without departing from the scopes defined by the claims.

The present application is based on and claims priority to Japanese patent application No. 2019-122049 filed on Jun. 28, 2019, with the Japanese Patent Office, the entire contents of which are hereby incorporated by reference.

What is claimed is:

1. A surface emitting laser, comprising:
a substrate;
a lower contact layer disposed on the substrate;
a semiconductor layer mesa including a lower reflector layer, an active layer, an upper reflector layer, and an upper contact layer which are laminated, in the order named, on the lower contact layer;
an annular electrode disposed on the upper contact layer; and
a light transmitting window situated inside the annular electrode to transmit laser light,
wherein the upper reflector layer includes a first region and a second region, the first region being inclusive of an area situated directly below the electrode and the light transmitting window, the second region being inclusive of an area outside the mesa and inclusive of a surrounding area of the first region within the mesa having the first region situated therein,
wherein a proton concentration in the first region is lower than a proton concentration in the second region, and
wherein the upper reflector layer has carbon doped therein as an impurity element, and the second region has the proton concentration therein higher than a carbon concentration therein.

2. The surface emitting laser as claimed in claim 1, wherein the first region has the proton concentration therein lower than a carbon concentration therein.

3. The surface emitting laser as claimed in claim 1, wherein the proton concentration in the second region is greater than or equal to $1\times10^{18}$ cm$^{-3}$ and less than or equal to $1\times10^{20}$ cm$^{-3}$.

4. The surface emitting laser as claimed in claim 1, further comprising a first electrode pad connected to the upper contact layer and a second electrode pad connected to the lower contact layer, wherein the first electrode pad and the second electrode pad are disposed on the second region.

* * * * *